US006785051B2

(12) United States Patent
Allan et al.

(10) Patent No.: US 6,785,051 B2
(45) Date of Patent: Aug. 31, 2004

(54) INTRINSIC BIREFRINGENCE COMPENSATION FOR BELOW 200 NANOMETER WAVELENGTH OPTICAL LITHOGRAPHY COMPONENTS WITH CUBIC CRYSTALLINE STRUCTURES

(75) Inventors: Douglas C. Allan, Corning, NY (US); James E. Webb, Fairport, NY (US); John H. Bruning, Pittsford, NY (US)

(73) Assignee: Corning Incorporated, Corning, NY (US)

( * ) Notice: Subject to any disclaimer, the term of this patent is extended or adjusted under 35 U.S.C. 154(b) by 34 days.

(21) Appl. No.: 10/195,198

(22) Filed: Jul. 15, 2002

(65) Prior Publication Data

US 2003/0021026 A1 Jan. 30, 2003

Related U.S. Application Data

(60) Provisional application No. 60/306,206, filed on Jul. 18, 2001.

(51) Int. Cl.[7] ................................................ G02B 5/30
(52) U.S. Cl. ........................ 359/499; 359/483; 359/494; 359/500; 359/896; 356/32; 356/33; 356/351; 356/364; 356/365
(58) Field of Search ............................ 356/32, 33, 351, 356/364, 365; 359/483, 494, 500, 896, 40, 73, 82, 352, 499

(56) References Cited

U.S. PATENT DOCUMENTS

| 5,475,489 A | 12/1995 | Gottsche ..................... 356/364 |
| 5,576,854 A | 11/1996 | Schmidt et al. ............... 359/40 |
| 6,157,471 A | * 12/2000 | Bignolles et al. ............. 359/15 |
| 6,324,003 B1 | 11/2001 | Martin ....................... 359/494 |

FOREIGN PATENT DOCUMENTS

WO    WO 00/75697 A1    12/2000

OTHER PUBLICATIONS

"On the Signs of the Elasto–Optic Coefficients", J. Smit, Journal of Applied Physics 49[5], May 1978, pp 2935–2936.
*Phsical Properties of Crystals*, J.F. Nye, Clarenden Press, Oxford 2000, Chapter XIII entitled "Natural and Artificial Double Refraction. Second–order Effects".
"Optical Anisotrophy of Silicon Single Crystals", J. Pasternak and K. Vedam, Physical Review B vol. 3, No. 8, Apr. 16, 1971, pp 2567–2571.
"Intrinsic Birefringence in Crystalline Optical Materials: a New Concern for Lithography", J.H. Burnett, Z.H. Levine and E.L. Shirley, Future FAB International, Issue 12, pp 149–154.
"Intrinsic Birefringence in Calcium Fluoride", J.H. Burnet, Z.H. Levine, and E.L. Shirley, Glass and Ceramics, #2065, 66 1–17. (Not published as of Jul. 18, 2001.).
"Current Status of Nikon's Investigation on CaF2 Intrinsic Birefringence", N. Shiraishi, S. Owa, Y. Ohmura, T, Ozawa, and I. Tanaka, Intl–SEMATECH Calcium Fluoride Birefringence Workshop, Jul. 18, 2001, pp 1–15.

(List continued on next page.)

*Primary Examiner*—Audrey Chang
*Assistant Examiner*—Craig Curtis
(74) *Attorney, Agent, or Firm*—Walter M. Douglas

(57) ABSTRACT

Stress-induced photoelastic birefringence compensates for intrinsic birefringence of cubic crystalline structures in deep ultraviolet (less than 200 nm) microlithographic imaging systems. Both the photoelastic birefringence and the intrinsic birefringence are expressed in a tensor format simplified by the symmetries of cubic crystalline structures. The stress-induced photoelastic birefringence can be sized to individually compensate for intrinsic birefringence exhibited in the same optical elements or preferably to collectively compensate for the cumulative effects of intrinsic birefringence in other optical elements in the lithography system.

20 Claims, 2 Drawing Sheets

OTHER PUBLICATIONS

"Intrinsic Birefringence in 157 nm Materials", J.H. Burnett, Z.H. Levine and E.L. Shirley, presented at the SEMATECH Calcium Fluoride Birefringence workshop, Jul. 18, 2001.

"Intrinsic Birefringence in CaF2", C. Zeiss and D. Krahmer, CaF2 Birefringence Workshop, pp 1–3.

"Simulation of Intrinsic Birefringence of CaF2 in CODE V®"; SEMATECH Calcium Fluoride Birefringence Workshop Jul. 18, 2001.

"Influence of the Intrinsic Birefringence in F2 Projection System", A. Suzuki and Y. Unno, Calcium Fluoride Birefringence Workshop, Jul. 18, 2001.

"Birefringence of CaF2", K. Nattermann and S, Glass, Natl. CaFL801 doc., Jul. 23, 2001, pp 1–3.

"Intrinsic Birefringence Impact On The ASML Wilton 157nm Lens", B. Tirri and M. Albert, Intrinsic Biref Sematech, Jul. 17, 2001, slide 1 through slide 15.

"Lens Design Software Code V® Modification", C. Van-Peski, International Sematech, Jul. 18, 2001, pp1–4.

"157 nm Birefringence Measurement System Using PEM Technology", B. Wang, Hinds Instruments.

"Intrinsic Birefrigence Workshop", J. Webb, Jul. 18, 2001, Corning Tropel.

* cited by examiner

INTRINSIC BIREFRINGENCE COMPENSATION FOR BELOW 200 NANOMETER WAVELENGTH OPTICAL LITHOGRAPHY COMPONENTS WITH CUBIC CRYSTALLINE STRUCTURES

RELATED APPLICATIONS

This application claims the benefit of U.S. Provisional Application No. 60/306,206 filed on Jul. 18, 2001, which provisional application is incorporated by reference herein.

TECHNICAL FIELD

The invention relates to deep ultraviolet microlithography systems and to optical elements of such imaging devices, particularly those used for imaging wavelengths shorter than 200 nanometers (nm), by controlling photoelastic birefringence in cubic crystal structures of the optical elements to counteract intrinsic birefringence apparent at the shorter wavelengths.

BACKGROUND

The imaging of shorter wavelengths of light beneath the visible spectrum with cubic crystalline materials such as calcium fluoride ($CaF_2$), barium fluoride ($BaF_2$), and strontium fluoride ($SrF_2$) can be detrimentally affected by details of their crystal structures that are of less consequence to longer wavelengths. Atomic details of the crystal structures, whose effects are normally subject to averaging at the longer wavelengths, can produce a pronounced birefringence at wavelengths beneath the visible spectrum.

The unwanted birefringence reduces the quality and performance of optical elements, particularly those used in optical imaging systems. Care is normally taken to avoid or reduce photoelastic birefringence resulting from unbalanced stresses acting on optical materials. Annealing is commonly used to relieve internal stresses, and mounting systems are generally designed to avoid applying external stresses. However, even if the photoelastic birefringence is entirely avoided, the intrinsic birefringence remains as a problem for optical systems employing shorter wavelengths such as those within the ultraviolet spectrum.

A paper entitled "On the Signs of the Elasto-Optic Coefficients" by Jan Smit, published by the Journal of Applied Physics 49[5], May 1978 on pages 2935–2936 provides mathematical support for understanding the use of photoelastic constants for describing the effects of stresses in a range of optical materials, and this paper is hereby incorporated by reference. A more complete treatment of the photoelastic behavior of crystalline structures is found in a text entitled *Physical Properties of Crystals*, by J. F. Nye, published by Clarenden Press, Oxford, 2000, particularly chapter XIII entitled "Natural and Artificial Double refraction. Second-Order Effects". The entire text as it relates to the issue of birefringence is hereby incorporated by reference. A similar treatment of silicon crystals that exhibit intrinsic birefringence in the infrared spectrum is disclosed in a paper entitled "Optical Anisotropy of Silicon Single Crystals" by J. Pastrnak and K. Vedam published by Physical Review B, volume 3, number 8, pages 2567–2571, Apr. 16, 1971, which is also hereby incorporated by reference.

SUMMARY OF INVENTION

Our invention in one or more of its preferred embodiments compensates for the intrinsic birefringence of optical elements with cubic crystalline structures by producing counteracting photoelastic birefringence within the same or similar optical elements. Stresses applied to the optical elements in selected magnitudes and directions alter the effective crystal structures of the optical elements producing a photoelastic birefringence that combines with the intrinsic birefringence to reduce overall birefringence in directions of intended light propagation through the optical elements. Improvements in the quality and performance of the optical elements with reduced birefringence are expected.

The perturbations produced by both intrinsic birefringence and photoelastic birefringence in a crystal element can be expressed as changes to a rank two dielectric impermeability tensor $B_{ij}$ whose elements define an index ellipsoid sometimes referred to as an "indicatrix". Intersections of the index ellipsoid with a plane normal to the direction of light propagation through the defined crystal element form an ellipse whose major and minor axes represent maximum and minimum refractive indexes and their two orthogonal directions. Differences between the lengths of the two axes are minimized to reduce birefringence in the considered direction of propagation. Optimization routines can be used to minimize overall birefringence throughout a range of directions responsible for carrying out imaging or other optical functions through the crystal element.

The changes in the dielectric impermeability tensor as a result of photoelastic birefringence can be expressed a matrix product of an array of optical constants arranged a rank four tensor $q_{ijkl}$ and an array of stress components $\sigma_{kl}$ arranged as a rank two tensor. Similarly, the changes to the dielectric impermeability tensor as a result of intrinsic birefringence can be expressed as a matrix product of an analogous rank four tensor $R_{ijkl}$ and components $k_k$ and $k_l$ of a nonzero photon wavevector k. The two matrix products can be added together to combine the elements of photoelastic and intrinsic birefringence. The symmetries of cubic crystals greatly simplify the combined expressions into a limited number of terms, which allow the influence of stresses to be observed on the total birefringence exhibited in selected directions of light propagation.

The stresses required to compensate for the intrinsic birefringence can be applied in the form of tensile stress, compressive stress, or shear stress. Conventional piezoelectric elements or adjustable mechanical fixturing can be used to apply the required stresses from points external to the crystal elements. Similar stresses can also be introduced by controlling thermal gradients in the crystal elements or by ion diffusion, such as practiced for making gradient index lenses.

The intrinsic birefringence can also be reduced by controlling polarization characteristics of the light propagating through the crystal elements. Although the wavelength of the propagating light may be selected for meeting certain imaging or resolution requirements, the polarization characteristics of the light can be controlled to reduce the effects of birefringence. For example, polarizations with desired orientations or symmetries (e.g., three-fold symmetry) can be used to match crystal characteristics to reduce the magnitude of intrinsic birefringence rather than counteract intrinsic birefringence with an opposite photoelastic birefringence.

The corrections made for intrinsic birefringence of a plurality of crystal elements within a common optical lithography system can be made individually within each of the crystal elements or collectively within a selected one or more but less than all of the crystal elements. A cumulative amount of birefringence exhibited by a combination of crystal elements in an optical system can be determined, and corrections can be made by producing an opposite amount of photoelastic birefringence in one of the crystal elements or in a combination of the crystal elements. The photoelastic birefringence produced in individual crystal elements does not necessarily match the intrinsic birefringence exhibited by the same crystal elements, but contributes to an amount of photoelastic birefringence that matches (or at least significantly reduces) the cumulative amount of intrinsic birefringence exhibited by the combination of crystal elements within an optical system. For example, the counteracting photoelastic birefringence produced in one of the optical elements can be sized (a) significantly larger than the intrinsic birefringence exhibited by the one optical element and (b) not significantly larger than the cumulative intrinsic birefringence exhibited by the combination of optical elements. Birefringence from other sources can be similarly corrected.

DRAWING

DETAILED DESCRIPTION

Figure 1:
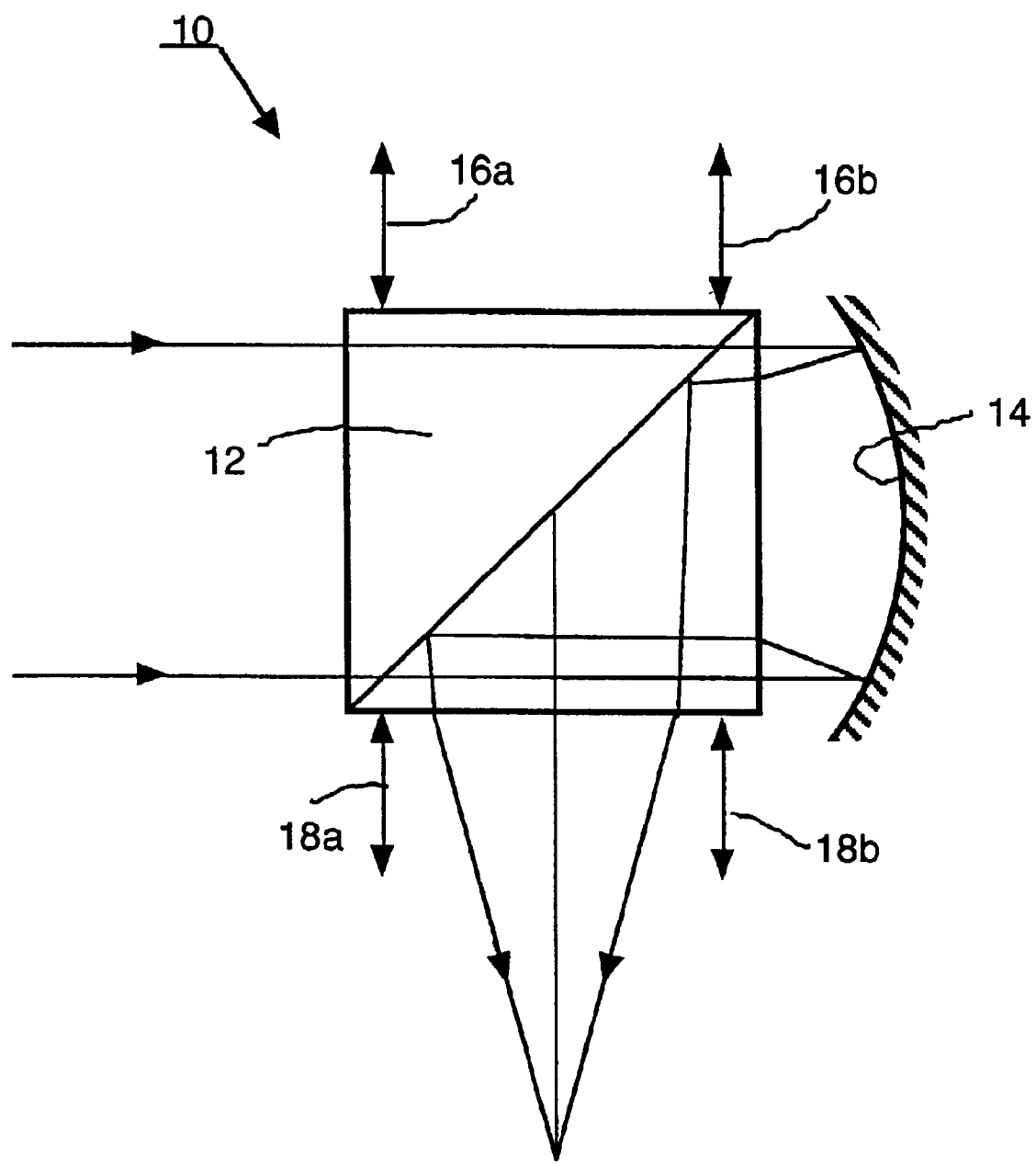
FIG. 1 is a schematic view of an imaging system having a Newtonian form with external stresses applied to a beamsplitter cube to compensate for the intrinsic birefringence of the cube.

Intrinsic birefringence arising at a nonzero photon wavevector k (e.g. at deep or vacuum ultraviolet wavelengths less than 200 nm) can be treated mathematically in a fashion analogous to the treatment of photoelastic birefringence arising as a result of stress. Specifically, both perturbations to a dielectric impermeability tensor can be expressed in terms of rank four tensors that have particular transformation properties under the symmetries of a cubic crystal. The exemplary mathematical treatments presented below pertain to cubic crystals of m3m symmetry, such as $CaF_2$, $BaF_2$, or $SrF_2$. Because the two perturbations, stress and nonzero wavevector propagation, can be applied independently, and because the perturbations to the dielectric properties are very small, the two perturbations add in a simple fashion. Thus, one may purposely design an externally applied stress (or equivalently, strain) to cause an optimal cancellation of the intrinsic birefringence.

The following mathematical expressions show how the two perturbations, applied stress (producing photoelastic birefringence) and nonzero wavevector propagation's (producing intrinsic birefringence), both quantitatively alter the index of refraction of the cubic crystal materials. (Stress and strain are related through the elastic properties of the material, so we may choose to formulate the expressions in terms of either quantity.) The applied stresses can be chosen to minimize (i.e., counteract) the most detrimental effects of intrinsic birefringence.

We begin with a formulation similar to one presented in the above-referenced text by J. F. Nye, entitled Physical Properties of Crystals, for stress-induced (photoelastic) birefringence. A rank two tensor $B_{ij}$, referred to as a dielectric impermeability tensor, is the inverse dielectric tensor. We work with this tensor because its elements define an index ellipsoid through the relation $$x_i B_{ij} x_j = 1$$

The index ellipsoid is used to find the index of refraction for different polarizations and different directions of light propagation in a material. For example, in the absence of intrinsic birefringence (e.g., a zero photon wavevector) and with no applied stress, the index ellipsoid is a sphere given by the equation $$B^{(0)}(x_1^2 + x_2^2 + x_3^2) = 1$$

where $B^{(0)} = (1/n^{(0)})^2$ and $n^{(0)}$ is the index of refraction in the absence of perturbations. In this case, the index of refraction is isotropic, as expected in a cubic material for long wavelength (k=0) and no stress.

To account for changes in $B_{ij}$ as a result of stress, we use a stress-optical constant $q_{ijkl}$. These numbers constitute a rank four tensor $q_{ijkl}$, as described on page 248 in equation (23) of the Nye text (denoted there as $\pi_{ijkl}$). In response to stresses, expressed in full generally as a rank two tensor $\sigma_{kl}$, the change in $B_{ij}$ is then given by $$\Delta B_{ij} = q_{ijkl} \sigma_{kl}$$

Intrinsic birefringence is also expressed as a rank four tensor (to order $k^2$), so we introduce the notation $R_{ijkl}$ analogous to $q_{ijkl}$ from above. Thus, the full expression for changes in index of refraction, or induced birefringence, in the presence of both strain and intrinsic birefringence, is given by $$\Delta B_{ij} = q_{ijkl} \sigma_{kl} + R_{ijkl} k_k k_l$$

where $k_k$ represents the component of wavevector k in the k direction. The goal of optimization is to choose stresses $\sigma_{kl}$ that cause the above equation to be minimum or zero for the most important wavevectors k.

The immediately above equation for $\Delta B_{ij}$ can be much simplified when the symmetries of a cubic crystal are recognized. Applying these symmetries, one may derive $$\Delta B_{11} = q_{11}\sigma_{11} + q_{13}(\sigma_{22}+\sigma_{33}) + R_{11}k_1^2 + R_{12}(k_2^2+k_3^2)$$

$$\Delta B_{22} = q_{11}\sigma_{22} + q_{12}(\sigma_{11}+\sigma_{33}) + R_{11}k_2^2 + R_{12}(k_1^2+k_3^2)$$

$$\Delta B_{33} = q_{11}\sigma_{33}q + {}_{12}(\sigma_{11}+\sigma_{22}) + R_{11}k_3^2 + R_{12}(k_1^2+k_2^2)$$

$$\Delta B_{32} = q_{44}\sigma_{32} + R_{44}k_2k_3$$

$$\Delta B_{31} = q_{44}\sigma_{31} + R_{44}k_1k_3$$

$$\Delta B_{21} = q_{44}\sigma_{21} + R_{44}k_1k_2$$

Here a contracted 2-index notation is used for the tensors q and R as described in the Nye text. The 4-index and 2-index versions are related in both cases as $$t_{1111} \rightarrow t_{11}$$

$$t_{2211} \rightarrow t_{21}$$

$$t_{3232} \rightarrow t_{22}/2$$

where t represents q or R, and all other components are zero or are related by symmetry. In the case of a cubic crystal such as $CaF_2$, there are only three stress-optical constants, given by $q_{11}$, $q_{12}$, and $q_{44}$, as seen in the $\Delta B_{ij}$ expansions. There are also, by analogy, only three constants needed to define the intrinsic birefringence tensor, given by $R_{11}$, $R_{12}$, and $R_{44}$ also as seen above. One may identify the most detrimental ray direction k due to intrinsic birefringence and then choose values of stress $\sigma_{kl}$ to make the detrimental birefringence small or zero.

The intrinsic birefringence of cubic systems is known to be largest along any of the <110> directions and to be zero along <100> and <111> directions. This section shows how an applied stress can correct the birefringence back to zero along the [110] direction.

Consider a photon wavevector $k=k/\sqrt{2}$ (110) and examine the birefringence given by $n_{[001]}-n_{[-110]}$. This difference of indices of refraction for the two polarizations [001] and [−110] has been measured recently at a value of $n_{[001]}-n_{[-110]}=+6.5\times10^{-7}$. The resulting $\Delta B_{ij}$ expansions simplify to $$\Delta B_{11}=q_{11}\sigma_{11}+q_{12}(\sigma_{22}+\sigma_{33})+(R_{11}+R_{12})k^2/2$$

$$\Delta B_{22}=q_{11}\sigma_{22}+q_{12}(\sigma_{11}+\sigma_{33})+(R_{11}+R_{12})k^2/2$$

$$\Delta B_{33}=q_{11}\sigma_{33}+q_{12}(\sigma_{11}+\sigma_{22})+R_{12}k^2$$

$$\Delta B_{32}=q_{44}\sigma_{32}$$

$$\Delta B_{31}=q_{44}\sigma_{31}$$

$$\Delta B_{21}=q_{44}\sigma_{21}+R_{44}k_2/2$$

For simplicity, we choose not to apply stress components $\sigma_{32}$ and $\sigma_{31}$ because there are no analogous terms from intrinsic birefringence, i.e., set $\sigma_{32}$ and $\sigma_{31}$ to zero. As a result, the eigenvalues of the $\Delta B$ array are relatively easily found, and two eigenvectors point along polarization directions [001] and [−110] as desired for this example. The simplest eigenvalue, with accompanying eigenvector [001], is given by just the tensor element $\Delta B_{33}$ by itself, i.e. $\Delta B_{33}=q_{11}\sigma_{33}+q_{12}(\sigma_{11}+\sigma_{22})+R_{12}k^2$. The other eigenvalue requires diagonalizing the 2×2 matrix made of the remaining nonzero tensor components $$\begin{bmatrix} \Delta B_{11} & \Delta B_{21} \\ \Delta B_{21} & \Delta B_{22} \end{bmatrix}$$

using the expressions from above. If we choose to keep $\sigma_{11}=\sigma_{22}$, then $\Delta B_{11}=\Delta B_{21}$ and the analysis is simplified somewhat. Finally, the eigenvalue associated with eigenvector [−110] is $\Delta B_{11}-\Delta B_{21}=q_{11}\sigma_{11}+q_{12}(\sigma_{22}+\sigma_{33})+(R_{11}+R_{12})k^2/2-(q_{44}\sigma_{21}+R_{44}k^2/2)$. Since we formulated the analysis in terms of the inverse of the dielectric tensor, the eigenvalues are equal to the changes in $1/n^2$ where n is the index of refraction. Thus, the final difference in refractive indices, induced by the combination of intrinsic birefringence and also applied stresses (i.e., photoelastic birefringence) as described above, is $$n_{[001]}-n_{[-110]}=$$
$$-\frac{1}{2}(n_0^3)\{[R_{44}-(R_{11}-R_{12})]k^2/2+(q_{11}-q_{12})(\sigma_{33}-\sigma_{22})+q_{44}\sigma_{21}\}$$

where $n_o$ is the index of refraction in the absence of perturbations, and, because of our assumptions, $\sigma_{11}=\sigma_{22}$. The term in $k^2$ represents exactly what has been measured for intrinsic birefringence, so it can be replaced by $+6.5\times10^{-7}$. This brings us to $$n_{[001]}-n_{[-110]}=6.5\times10^{-7}-\frac{1}{2}(n_0^3)(q_{11}-q_{12})(\sigma_{33}-\sigma_{22})+q_{44}\sigma_{21}$$

The unperturbed index at 157 nm wavelength is about 1.5586. Values for the stress-optical constants are very approximately $$q_{11}=-0.38$$

$$q_{12}=+1.08$$

$$q_{44}=+0.71$$

in units of $10^{-6}$/MPa. This brings us to $$n_{[001]}-n_{[-110]}=6.5\times10^{-7}-1.893(-1.46\times10^{-6})(\sigma_{33}-\sigma_{22})+0.71\times10^{-6}\sigma_{21}$$

for stresses in MPa. There are several choices we can make for applied stresses to make the immediately above equation go to zero. One possibility is the application of a tensile stress $\sigma_{22}=\sigma_{11}$ of +0.235 MPa. Another is the application of a compressive stress along [001] of $\sigma_{33}=-0.235$ MPa. A third choice is the application of a compressive shear stress $\sigma_{21}$ of 0.915 MPa. This last would be achieved by applying compressive stress on the axes at 45 degrees from [100] and [010]. The precise choice of applied stresses can be determined by taking into account the elastic relaxation of the sample under external stress, and also more fully treating the range of rays whose birefringence is to be minimized.

FIG. 1. shows and exemplary lithographic imaging system 10 having a Newtonian form for deep ultraviolet (below 200 nm) imaging. A beamsplitter cube 12 is combined with a concave mirror 14 that provides focusing power to produce images without obscuration. Polarization elements such as waveplates (not shown) can be used to reduce the amount of light lost from the beamsplitter cube 12. Refractive optics such as lenses (not shown) can be used to perform aberration correction or add focusing power.

The beamsplitter cube 12 is preferably made of calcium fluoride having a m3m cubic crystalline structure. Arrows 16a, 16b, 18a, and 18b applied just beyond optically active portions of the beamsplitter cube 12 are representative of stress inducers that impart stresses at magnitudes and in directions required to produce photoelastic birefringence optimized to counteract intrinsic birefringence arising as a result of the directions, polarizations, and wavelengths of light propagating through the beamsplitter cube 12. The arrows 16a, 16b, 18a, and 18b can be replaced by appropriate mechanical, electromechanical, thermal or other known stress inducers. The arrows can also be understood to represent strain induced by ion implantation or other internal reactions.

Figure 2:
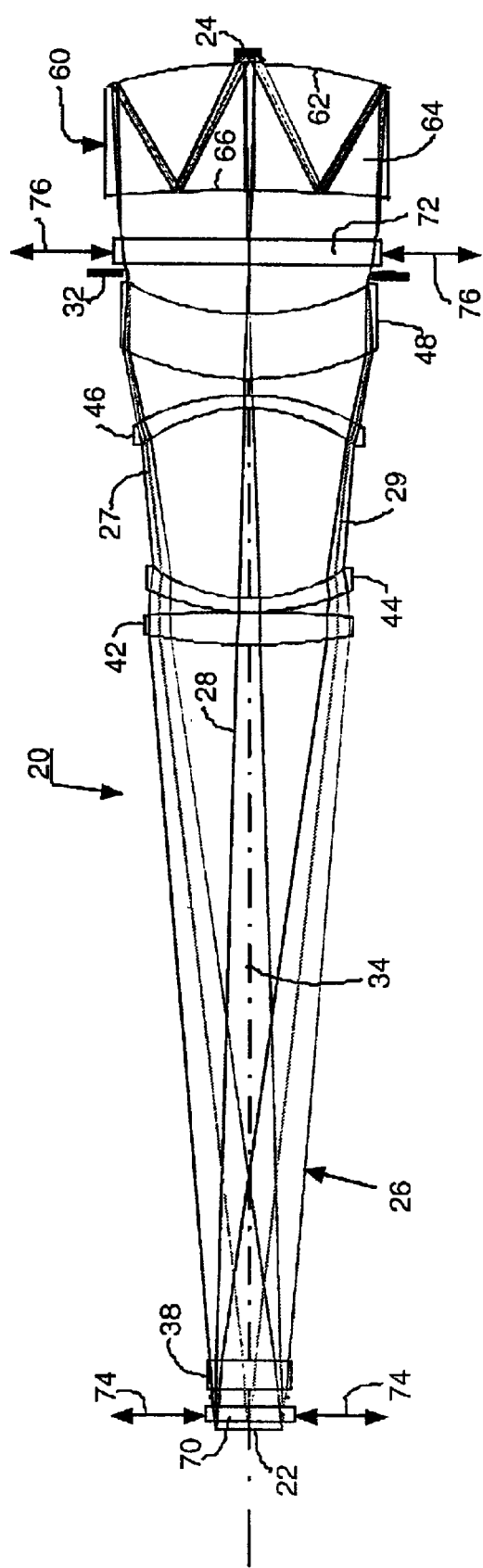
FIG. 2 is a more detailed schematic view of a catadioptric imaging system containing two different compensating optics with applied stress.

An alternative catadioptric imaging system 20 is shown in more detail in FIG. 2. The imaging system 20 is particularly useful as a microlithographic projection system operating at deep-ultraviolet wavelengths below 200 nm and particularly at wavelengths near 157 nanometers for imaging a reticle 22 (an object plane) onto a photoresist layer of a wafer substrate 24 (an image plane). A beam 26 of the ultraviolet light initially captures information contained in the reticle 22 in a telecentric form within the imaging system 20. After passing through the reticle 22, the beam 26 remains in the telecentric space for a limited distance after a focusing optic 38, which directs chief rays 28 of object points on the reticle 22 on a gradually converging path toward a center of an aperture stop 32. The beam 26 itself, including marginal rays 27 and 29, continues to gradually diverge to fill the aperture stop 32.

Focusing optics 42, 44, 46, and 48 direct the beam 26 through a pupil space containing the aperture stop 32. The focusing optic 38 and the focusing optics 42, 44, 46, and 48, constitute a front focal group in advance of the aperture stop 32 responsible for establishing a focal length, which together with the numerical aperture of the beam 26 entering the imaging system 10, set a diameter of the aperture stop 32. The long focal length apparent from FIG. 2 provides for converging corresponding the chief rays 28 as well as corresponding marginal rays 27 or 29 of the object points through minimum angles with respect to each other. In the vicinity of the aperture stop 32 where the corresponding rays intersect, significant radial divergence of the corresponding rays 27, 28, or 29 is not apparent. Accordingly, the pupil space within which the corresponding rays 27, 28, or 29 approximately overlap extends well to either side of the aperture stop 32.

All of the transmissive optics 38, 42, 44, 46, and 48 of the front focal group are preferably made of a single crystal material such a calcium fluoride ($CaF_2$). Other cubic crystals that might also be used for constructing the front optics include barium fluoride ($BaF_2$) and strontium fluoride ($SrF_2$). The calcium fluoride ($CaF_2$) crystal material is preferably oriented with one of its <111> axes aligned with a common optical axis 34. Light rays traveling parallel or nearly parallel to the optical axis 34 acquire little of the birefringence effect that becomes more pronounced at larger angles of departure. The optics 38, 42, 44, and 48 of the front focal group exhibit little optical power (i.e., little bending of the light rays toward or away from the optical axis). Therefore, only small intrinsic birefringence effects accumulate with the passage of the light beam 26 through the front focal group.

A double-reflecting Mangin mirror 60 receives the beam 26 in a nearly collimated form but reflects the beam 26 from a curved reflective surface 62 on a converging path through a transmissive element 64 that is also preferably made of a single crystal material such as calcium fluoride ($CaF_2$). Alternatives include barium fluoride ($BaF_2$) and strontium fluoride ($SrF_2$). A partially reflective surface 66 re-reflects the beam 26 on a further converging path back through the transmissive element 64, exiting the Mangin mirror 60 through an aperture in the curved reflective surface 62. The converging beam 26 exiting the Mangin mirror 60 produces a reduced image of the reticle 22 onto the photoresist layer of the wafer substrate 24.

The two reflections of the Mangin mirror 60 provide a significant reduction in the image size together with a corresponding increase in numerical aperture. However, the beam 26 and particularly marginal rays 27 and 29 of the beam 26 traverse the transmissive element 64 at considerable angular departures from the optical axis 34. Significant intrinsic birefringence effects accumulate with each pass.

Two corrective optics 70 and 72 are mounted within the catadioptric imaging system 20 to counteract the intrinsic birefringence accumulated by the transmissive optics 38, 42, 44, 46, and 48 of the front focal group as well as the more significant intrinsic birefringence contributed by the transmissive element 64 of the Mangin mirror 60. The corrective optic 70 is located in the telecentric space where the object rays 28 extend parallel but offset from one another. The corrective optic 72 is located in the pupil space where the object rays 28 converge but overlap each other.

Both corrective optics 70 and 72 are preferably made of cubic crystalline materials similar to the other transmissive optics of the imaging system 20. However, the, corrective optics 70 and 72 are stressed as shown by arrows 74 and 76 representative of stress inducers to exhibit a photoelastic birefringence that counteracts not only their own intrinsic birefringence but also the intrinsic birefringence accumulated by the other transmissive optics of the imaging system 20. The amount of intrinsic birefringence apparent within the telecentric space and the pupil space varies in accordance with the internal ray angles of the beam 26 as the beam 26 propagates through each of the transmissive focusing optics 38, 42, 44, 48, and 64 and through the two corrective optics 70 and 72.

A combination of ray tracing and the tensor notation listed above can be used to quantify the cumulative intrinsic birefringence as well as to quantify the required photoelastic birefringence required of the corrective optics 70 and 72 to effectively reduce the total birefringence of the optical system 20. The counteracting photoelastic birefringence exhibited by each of the corrective optics 70 and 72 is significantly larger than the intrinsic birefringence exhibited by the corrective optics 70 and 72 themselves but is not significantly larger than the cumulative intrinsic birefringence exhibited by the combination of transmissive optics. Together, the additional photoelastic birefringence exhibited by the two corrective optics 70 and 72 preferably matches the cumulative birefringence of the remaining transmissive optics of the imaging system 20.

Although two corrective optics 70 and 72 are illustrated in FIG. 2, more or less corrective optics can be used in similar or different locations in other imaging systems. The corrective optics themselves can be made of a variety of cubic crystalline materials that respond to stresses by producing photoelastic birefringence, including cubic crystalline materials having signs of intrinsic birefringence opposite to other optics of the same imaging system. However, in our preferred embodiment, all of the transmissive optics of the imaging system including the corrective optics are made of calcium fluoride ($CaF_2$) material. Although separate plate-shaped corrective optics are preferred for purposes of simplicity, shapes that are more complex can be used to produce additional compensating effects. Individual focusing optics can also be stressed to compensate for their own or other intrinsic birefringence within an optical system. Additional details of alternative imaging systems benefiting from this invention are disclosed in co-pending U.S. provisional application No. 60/362,234 filed on Mar. 6, 2002 and entitled "Compensator for Radially Symmetric Birefringence", which is hereby incorporated by reference.

In addition to counteracting intrinsic birefringence by stress induced photoelastic birefringence, the emergence of intrinsic birefringence can be reduced by controlling the polarization characteristics of the of the nonzero photon wavevector k defining the light propagating through the crystal element (e.g., beamsplitter cube 12). For example, polarizations can be selected that minimize components in the directions most subject to intrinsic birefringence. Polarization symmetries can also be used to further exploit the symmetries of crystal structures.

Although our invention is intended to reduce or counteract intrinsic birefringence arising in cubic crystal structures by nonzero photon wavevectors at wavelengths beneath the visible spectrum, similar benefits can be obtained in other crystalline structures where intrinsic birefringence arises in other portions of the spectrum. For example, silicon has a cubic structure subject to intrinsic birefringence in the infrared spectrum and could similarly benefit from the counteracting effects of stress-induced photoelastic birefringence. In addition, although applied stresses are intended to counteract intrinsic birefringence, the applied stresses can also be adjusted to compensate for birefringence arising from other sources including material fabrication, material growth, and assembly.

We claim:

1. A method of counteracting intrinsic birefringence arising as a result of a nonzero photon wavevector in a crystal element of an optical system comprising the steps of:

determining stress required to produce a counteracting stress-induced birefringence in the crystal element; and applying the determined stress to the crystal element to reduce a total birefringence exhibited by the crystal element in a direction of propagation of the nonzero photon wavevector.

2. The method of claim 1 in which the step of determining includes expressing intrinsic birefringence in the crystal element as a dielectric impermeability tensor.

3. The method of claim 2 in which the step of determining stress includes also expressing the counteracting stress-induced birefringence in the crystal element as a dielectric impermeability tensor.

4. The method of claim 3 in which the dielectric impermeability tensor defines an index ellipsoid whose intersections with a plane normal to the direction of wavevector propagation through the crystal element form an ellipse whose major and minor axes represent maximum and minimum refractive indexes and their two orthogonal polarization directions.

5. The method of claim 4 in which the step of applying the determined stress includes minimizing differences between the lengths of the two axes to reduce the total birefringence in the direction of propagation.

6. The method of claim 1 in which the step of determining stress includes optimizing a reduction in the total birefringence throughout a range of directions responsible for carrying out optical functions through the crystal element.

7. The method of claim 1 in which the step of applying the determined stress includes ion implantation within the crystal element.

8. The method of claim 1 in which the step of applying the determined stress includes controlling thermal gradients in the crystal element.

9. The method of claim 1 including a further step of controlling polarization characteristics of the wavevector propagating through the crystal element.

10. A method of compensating for intrinsic birefringence of transmissive materials in an optical system comprising steps of:
  arranging a combination of optical elements within an optical system, at least some of the optical elements exhibiting separate amounts of intrinsic birefringence;
  determining a cumulative intrinsic birefringence exhibited by the combination of optical elements within the optical system;
  inducing a counteracting stress-induced birefringence in at least one of the optical elements exhibiting intrinsic birefringence; and
  sizing the counteracting stress-induced birefringence in the one optical element to be (a) significantly larger than the intrinsic birefringence exhibited by the one optical element (b) not significantly larger than the cumulative intrinsic birefringence exhibited by the combination of optical elements, and (c) opposite in sign to the cumulative intrinsic birefringence.

11. The method of claim 10 in which the step of sizing includes sizing the counteracting stress-induced birefringence to match the cumulative intrinsic birefringence.

12. The method of claim 10 in which the step of arranging includes arranging optical elements for transmitting light through a range of directions and the step of determining cumulative intrinsic birefringence includes determining intrinsic birefringence of the optical elements having regard for the range of directions of the light transmitted through the optical elements.

13. The method of claim 12 in which the step of arranging includes positioning the one optical element within a telecentric space of the optical system.

14. The method of claim 12 in which the step of arranging includes positioning the one optical element within a pupil space of the optical system.

15. The method of claim 10 in which the step of inducing includes inducing the counteracting stress-induced birefringence in at least two of the optical elements exhibiting intrinsic birefringence.

16. The method of claim 15 in which the step of sizing includes sizing the counteracting stress-induced birefringence exhibited together by the two optical elements to approximately match the cumulative intrinsic birefringence exhibited by the combination of optical elements.

17. An imaging system compensating for cumulative intrinsic birefringence of transmissive components comprising:
  an arrangement of optics including optics transmissive at an operating wavelength for producing an image of an object;
  a plurality of the transmissive optics being made of a cubic crystalline material exhibiting at the operating wavelength intrinsic birefringence that accumulates through the imaging system;
  a stress inducer that applies stress to a selected one of the transmissive optics at a magnitude and in a direction that produces a stress-induced birefringence counteracting not only the intrinsic birefringence exhibited by the selected transmissive optic but also the accumulated intrinsic birefringence exhibited by the plurality of transmissive optics.

18. The imaging system of claim 17 in which the arrangement of optics includes a telecentric space within which the selected one of the transmissive optics is located to counteract the accumulated intrinsic birefringence.

19. The imaging system of claim 17 in which the arrangement of optics includes a pupil space within which the selected one of the transmissive optics is located to counteract the accumulated intrinsic birefringence.

20. The imaging system of claim 17 in which the stress inducer is one of a plurality of stress inducers producing stress-induced birefringence at a magnitude that matches the cumulative intrinsic birefringence of the imaging system.

* * * * *